US012730605B2

(12) United States Patent
Andress et al.

(10) Patent No.: US 12,730,605 B2
(45) Date of Patent: Sep. 8, 2026

(54) AUDIO OUTPUT BASED ON DYNAMIC AUDIO FRAME SELECTION

(71) Applicant: Amazon Technologies, Inc., Seattle, WA (US)

(72) Inventors: Mark Andress, Seattle, WA (US); Saurabh Gupta, Edmonds, WA (US); Taylor Elliot Watson, Seattle, WA (US)

(73) Assignee: Amazon Technologies, Inc., Seattle, WA (US)

(*) Notice: Subject to any disclaimer, the term of this patent is extended or adjusted under 35 U.S.C. 154(b) by 68 days.

(21) Appl. No.: 18/893,358

(22) Filed: Sep. 23, 2024

(65) Prior Publication Data

US 2026/0086763 A1 Mar. 26, 2026

(51) Int. Cl.

| | |
|---|---|
| ***G06F 3/16*** | (2006.01) |
| ***G06F 16/683*** | (2019.01) |
| ***G10K 11/178*** | (2006.01) |
| ***H03G 3/30*** | (2006.01) |

(52) U.S. Cl.

CPC ............ *G06F 3/165* (2013.01); *G06F 16/683* (2019.01); *G10K 11/17823* (2018.01); *H03G 3/3089* (2013.01)

(58) Field of Classification Search

CPC . G06F 3/165; G06F 16/683; G10K 11/17823; H03G 3/3089

See application file for complete search history.

(56) References Cited

U.S. PATENT DOCUMENTS

| | | | |
|---|---|---|---|
| 9,319,782 | B1 | 4/2016 | Crump et al. |
| 9,916,839 | B1 | 3/2018 | Scalise et al. |
| 11,523,049 | B1 | 12/2022 | Tharakraj et al. |
| 12,464,087 | B1 | 11/2025 | Andress et al. |
| 12,579,185 | B1 | 3/2026 | Cross et al. |
| 12,587,401 | B1 | 3/2026 | Cross et al. |
| 2003/0016247 | A1 | 1/2003 | Lai et al. |

(Continued)

FOREIGN PATENT DOCUMENTS

| | | |
|---|---|---|
| AU | 2019380367 B2 | 5/2021 |
| CN | 109389969 A | 2/2019 |

(Continued)

OTHER PUBLICATIONS

Office Action received in UK Patent Application No. GB2515784.3, mailed Mar. 9, 2026, 6 pages.

*Primary Examiner* — Vivian C Chin
*Assistant Examiner* — Annabelle Kang
(74) *Attorney, Agent, or Firm* — Knobbe, Martens, Olson & Bear, LLP

(57) ABSTRACT

Systems and methods are provided to output audio data based on metadata associated with the audio data. A system can provide a buffer command to a plurality of computing devices. Based on providing the buffer command, the system can obtain, from the plurality of computing devices, a plurality of sets of audio data and a plurality of sets of metadata. The system can identify, for each time period of a plurality of time periods, a respective audio frame from the plurality of sets of audio data based on the plurality of sets of metadata. The system can generate a continuous audio stream based on identifying the respective audio frames and can route an output based on the continuous audio stream to a computing system.

20 Claims, 5 Drawing Sheets

(56) References Cited

U.S. PATENT DOCUMENTS

| | | | |
|---|---|---|---|
| 2011/0093598 | A1 | 4/2011 | Baratz et al. |
| 2011/0246950 | A1 | 10/2011 | Luna et al. |
| 2013/0282819 | A1 | 10/2013 | Mehta et al. |
| 2017/0064004 | A1 | 3/2017 | Volkmer |
| 2017/0217145 | A1 | 8/2017 | Yufu |
| 2020/0293260 | A1 | 9/2020 | Fitzgerald et al. |
| 2022/0022000 | A1 | 1/2022 | Bruhn et al. |
| 2022/0101382 | A1 | 3/2022 | Baldwin et al. |
| 2023/0281885 | A1 | 9/2023 | Park et al. |
| 2024/0146779 | A1 | 5/2024 | Ayanoglu et al. |
| 2024/0420400 | A1 | 12/2024 | Iwaki |
| 2025/0173952 | A1 | 5/2025 | Black et al. |
| 2026/0067406 | A1 * | 3/2026 | Rozen .................. H04M 3/568 |

FOREIGN PATENT DOCUMENTS

| | | | | |
|---|---|---|---|---|
| CN | 112151055 | A | 12/2020 | |
| CN | 121728194 | A | 3/2026 | |
| EP | 3070876 | A1 | 9/2016 | |
| WO | WO-2023184032 | A1 * | 10/2023 | ........... G10H 1/0058 |

* cited by examiner

AUDIO OUTPUT BASED ON DYNAMIC AUDIO FRAME SELECTION

BACKGROUND

Conferencing systems (e.g., videoconferencing systems) enable entities to communicate in real time via a network. Such systems may obtain audio data from sensors, process the data to generate an output, and transmit the same output to output devices. For example, the systems can obtain audio data from one device and transmit a same output based on the audio data to each other device connected to the systems. As multiple devices may be located at the same location, obtaining data and transmitting the same output in such a manner can increase resource utilization and can negatively impact the user experience. Further, the use of such a process can be time-consuming and inefficient.

BRIEF DESCRIPTION OF THE DRAWINGS

Throughout the drawings, reference numbers may be re-used to indicate correspondence between referenced elements. The drawings are provided to illustrate example embodiments described herein and are not intended to limit the scope of the disclosure.

DETAILED DESCRIPTION

Figure 1A:
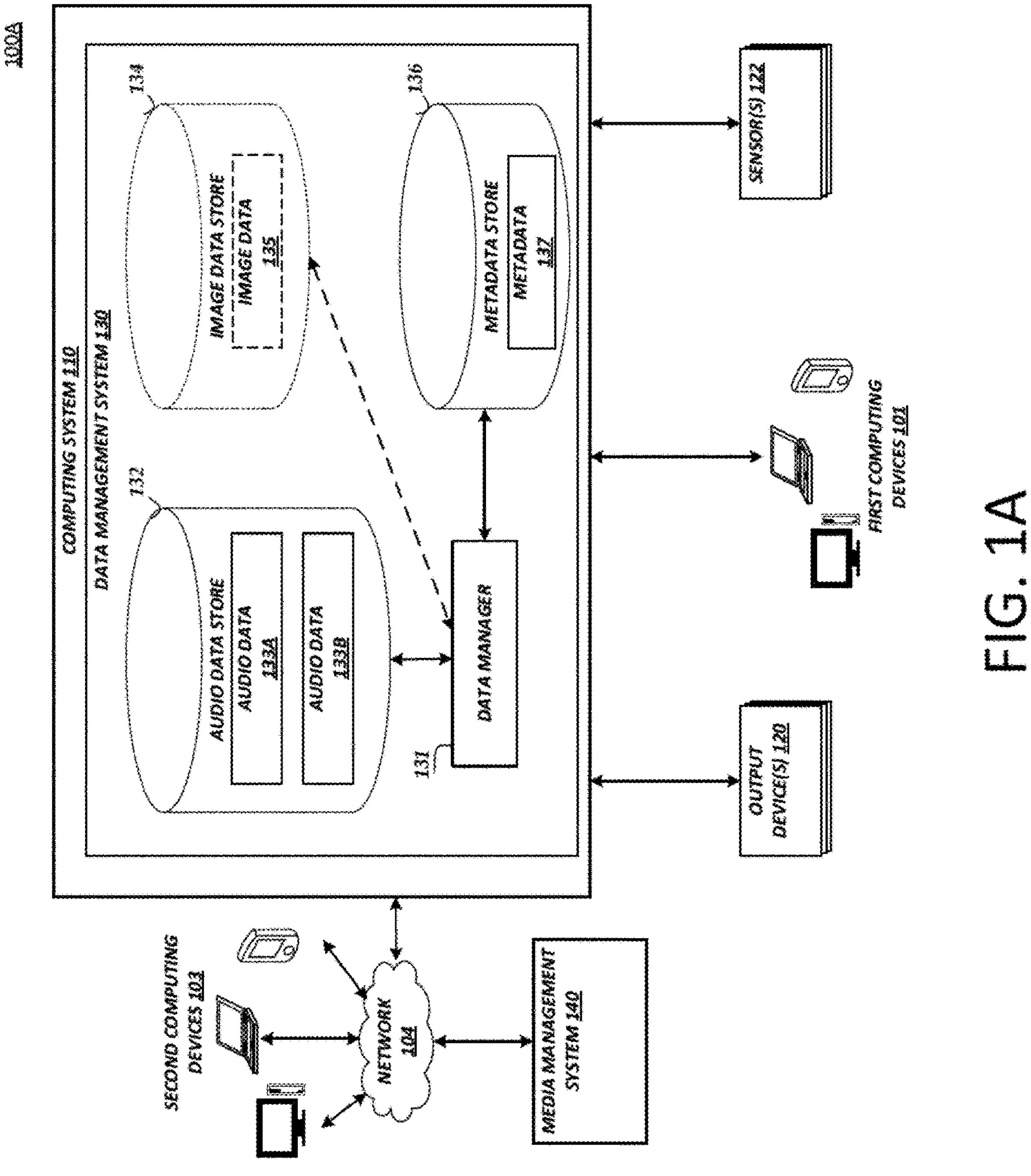
FIG. 1A is a block diagram depicting an illustrative environment in which a data management system can process data obtained from and/or to be routed to computing devices.

Generally described, aspects of the present disclosure relate to efficiently processing audio received from co-located devices as part of a co-located conference where multiple users are located in the same environment. Such a conferencing system may output overlapping audio based on the audio received from co-located devices. In such scenarios, given the overlapping audio in the audio received from the co-located devices, the audio output by a conferencing system may be ineffective (e.g., may not be intelligible). One approach to audio processing in such scenarios is to provide for wholly centralized devices within the environment. However, such centralized devices may be relatively expensive and complex.

Such a conferencing system, in some cases, may output audio received from in-room computing device(s) regardless of the quality, quantity, type, etc. of the audio captured by the in-room computing device(s). Thus, the output may be based on data received from the in-room computing device(s) regardless of whether a speaker is located closer to a different in-room computing device. Further, the output may be based on data received from an in-room computing device regardless of whether the in-room computing device is capturing more background noise, static, etc. compared to a different in-room computing device. In such cases, the output may include feedback, background noise, echo, static, crackling, etc. and may result in meeting inequity for co-located conferencing environments.

Another issue that may be of particular concern is that the computing devices providing audio may be misaligned and/or the audio may be misaligned. For example, the computing devices may provide audio at different times, may not provide audio for the same time period, etc. In such cases, such a conferencing system may be inefficient and/or ineffective.

By providing such an output, the conferencing system may cause substantial issues. For example, while the audio may be complete, intelligible, and/or clear for in-room participants, the output provided to out-of-room participants may be incomplete, unintelligible, and/or unclear. Such issues may be cascading (cumulative) issues and/or may reduce the functionality of the conferencing system (e.g., in that users may be unable to decipher the output) which may result in an undesirable user experience. For example, the issues may cumulatively grow as computing devices are added to the one or more first computing devices located in the same location (e.g., in-room computing devices for a conference).

Embodiments of the present disclosure address these problems by providing for efficient handling of audio in such scenarios without requiring complex, centralized audio processing equipment. Specifically, embodiments of the present disclosure enable a data management system to align audio from a plurality of computing devices (e.g., in-room computing devices) and dynamically select audio frames (e.g., select a customized set of audio frames, select, at run-time, a variable set of audio frames, etc.) from the aligned audio to generate an output without including the non-selected audio frames in the output. For example, a data management system can dynamically select an audio source, from a plurality of in-room audio sources, and associated audio for each time period of a plurality of time periods.

To enable the dynamic selection of an audio frame, the data management system may align in-room computing devices (e.g., in-room with the data management system). The data management system may align the in-room computing devices by providing an input to each of the in-room computing devices (e.g., forcing or commanding an alignment or synchronization of the in-room computing devices). For example, the data management system may align the in-room computing devices by providing an input indicating a time period for synchronization, a command to perform a synchronization, etc.

By aligning the in-room computing devices, the data management system may obtain audio data from all or a portion of the in-room computing devices such that the data management system may select a particular in-room computing device (and associated audio data) for inclusion in an output. For example, the data management system may obtain audio data that may include a first audio frame associated with (e.g., captured by) a first computing device, a second audio frame associated with a second computing device, a third audio frame associated with a third computing device, etc. that are each associated with the same time period.

In order to identify audio frames associated with the same time period and eligible for selection for the particular time period, the data management system may align (e.g., temporally align) the audio data. For example, the data management system may temporally align audio frames (e.g., align the audio frames according to a particular time period) from all or a portion of the plurality of in-room computing devices. In some cases, to align the audio data, for all or a portion of the plurality of in-room computing devices, the data management system may identify time stamps of the audio data received from the respective computing device and may align the audio data using the time stamps. In some cases, the data management system may filter (e.g., block, ignore, etc.) audio data that is associated with a different time stamp.

Using the aligned audio data, the data management system can compare the audio frames associated with the same time period and may select an audio frame from the audio frames associated with the same time period for generation of an output. For example, the data management system may select a first audio frame that is associated with a first computing device from the audio data for a first time period and a second audio frame that is associated with a second computing device from the audio data for a second time period (e.g., based on movement of a speaker, based on the first computing device picking up feedback and/or background noise during the second time period, etc.).

To select the audio frame, the data management system may obtain metadata (e.g., generated by the data management system, the plurality of in-room computing devices, a separate system, etc.) associated with the audio data that may be indicative of the quality of the audio data and may use the metadata to select the audio frame. For example, the audio data may be represented as a wave and the metadata may indicate an amplitude, a rate, a gap, etc. associated with the wave. In another example, the metadata may include one or more parameters (e.g., a location, a volume, a pitch, a speed, a timing, an intensity, etc.) associated with the data.

As the metadata may be indicative of a quality of the audio data (e.g., an amplitude, a rate, a gap, etc.), the data management system may use the metadata to identify and dynamically select an audio frame with a greater quality as compared to other audio frames associated with the same time period. For example, the data management system may use the metadata to identify and dynamically select an audio frame that is predicted to be representative of an environment for a particular time period. In some cases, the data management system may use the metadata to identify and dynamically select an audio frame with a largest amplitude, rate, gap, etc. as compared to other audio frames associated with the same time period.

Using the audio frames selected for all or a portion of the plurality of time periods, the data management system may generate audio data for out-of-room computing devices that provides an in-room experience. Specifically, the data management system may interleave the selected audio frames to generate an audio stream (e.g., a continuous audio stream) that includes an audio frame for each time period with a greater quality as compared to other audio frames associated with the same time period. The data management system may provide an output based on the audio data to the out-of-room computing devices (e.g., one or more remote computing devices).

To improve the quality and/or usability of the audio data that includes dynamically selected audio frames for each time period, the data management system can further process the audio data to generate the output and/or additional outputs. For example, the data management system may identify background noise and/or an echo and may suppress and/or cancel the background noise and/or echo to generate the output. In another example, the data management system may identify an active speaker associated with the output and may provide an identifier of the active speaker.

As will be appreciated by one of skill in the art in light of the present disclosure, the embodiments disclosed herein improve the ability of computing systems to enable and/or facilitate a conference (e.g., a conference call, a teleconference, a meeting, a call, a conferencing event, etc.) between multiple computing devices. Moreover, the presently disclosed embodiments address technical problems inherent within computing systems; specifically, the difficulties of customizing data transmitted between computing devices as part of a conference. These technical problems are addressed by the various technical solutions described herein, including the use of metadata to dynamically select audio frames. The dynamic selection of audio frames can provide elastic audio (e.g., an elastic audio input, an elastic audio output, etc.) in that an output and/or input may include the dynamic (e.g., elastic) selection of audio frames. Thus, the present disclosure represents an improvement on existing computing systems in general.

The foregoing aspects and many of the attendant advantages of this disclosure will become more readily appreciated as the same become better understood by reference to the following description, when taken in conjunction with the accompanying drawings.

FIG. 1A is a block diagram of an illustrative operating environment 100A in which first computing devices 101, second computing devices 103, one or more output device(s) 120, one or more sensor(s) 122, and a media management system 140 may interact with a computing system 110 via a physical connection or via a network 104. The computing system 110 may include and/or may utilize a plurality of connections (e.g., a plurality of channels) with the first computing devices 101, the second computing devices 103, the one or more output device(s) 120, the one or more sensor(s) 122, and/or the media management system 140. For example, the computing system 110 may utilize a different connection for all or a portion of the first computing devices 101.

By way of illustration, various example first computing devices 101 and second computing devices 103 are shown in communication with the computing system 110, including a desktop computer, laptop, and a mobile phone. In general, the first computing devices 101 and the second computing devices 103 can be any computing device such as a desktop, laptop or tablet computer, personal computer, wearable computer, server, personal digital assistant (PDA), hybrid PDA/mobile phone, mobile phone, electronic book reader, set-top box, voice command device, camera, digital media player, and the like.

The computing system 110 may provide the first computing devices 101 and the second computing devices 103 with one or more user interfaces, command-line interfaces (CLI), application programing interfaces (API), and/or other programmatic interfaces for participating in a conference. For example, the interfaces may include an identifier of an active speaker as determined by the computing system 110.

In some cases, all or a portion of the first computing devices 101 may be located at (e.g., hardwired at, affixed to, placed at, etc.) a first location. For example, the first location may be a room (e.g., a conference room) and the first computing devices 101 may be hardwired at a table located in the room. All or a portion of the first computing devices 101 may obtain sensor data (e.g., audio data) associated with the first location and/or may provide an output.

In some cases, all or a portion of the second computing devices 103 may be located at (e.g., hardwired at, affixed to, placed at, etc.) at one or more second locations different from the first location. For example, the second computing devices 103 may be portable user computing devices that may have a dynamic location (e.g., the location of the second computing devices 103 may be different over time). All or a portion of the second computing devices 103 may obtain sensor data associated with the one or more second locations and/or may provide an output.

In some cases, the second computing devices 103 may be remote from the first computing devices 101. For example, the first computing devices 101 may be computing devices of in-room entities (e.g., in-room participants) and the second computing devices 103 may be computing devices of remote entities (e.g., remote participants).

In some cases, the first computing devices 101 and/or the second computing devices 103 may be dynamic such that the number of the first computing devices 101 and/or the number of the second computing devices 103 may change over time (e.g., based on additional entities). For example, the number of first computing devices 101 may change depending on the number of in-room entities for a conference and the number of second computing devices 103 may change depending on the number of remote entities for the conference.

In some cases, the computing system 110 may identify one or more first locations as associated with a conference (e.g., main location of the conference, central location of the conference, origin of the conference, in person location of the conference, in-room location, etc.) and one or more second locations associated with the conference (e.g., remote locations). For example, the computing system 110 may identify the one or more first locations based on a user input, parsing a conference agenda, a number of computing devices connecting to the conference via the one or more first locations as opposed to one or more second locations, etc. In another example, the computing system 110 may determine that more computing devices are connecting to the conference via a first location as compared to computing devices connecting to the conference via one or more second locations and the computing system 110 may identify the first location as an in-room location. Based on identifying the one or more first locations, the computing system 110 may classify one or more computing devices as first computing devices 101 (computing devices joining via the one or more first locations) or second computing devices 103 (computing devices joining via one or more second locations).

The media management system 140 may be any computing system for implementing a communications platform to enable connections between computing devices. The communications platform may provide computing devices with an interface (e.g., an application programming interface) that enables the computing devices to share data. For example, the communications platform may enable computing devices to share audio data, text data, video data etc. In some cases, the communications platform may enable real time communications.

The first computing devices 101, the second computing devices 103, the media management system 140, and the computing system 110 may communicate via a network 104, which may include any wired network, wireless network, or combination thereof. For example, the network 104 may be a personal area network, local area network, wide area network, over-the-air broadcast network (e.g., for radio or television), cable network, satellite network, cellular telephone network, or combination thereof. As a further example, the network 104 may be a publicly accessible network of linked networks, possibly operated by various distinct parties, such as the Internet. In some embodiments, the network 104 may be a private or semi-private network, such as a corporate or university intranet. The network 104 may include one or more wireless networks, such as a Global System for Mobile Communications (GSM) network, a Code Division Multiple Access (CDMA) network, a Long Term Evolution (LTE) network, or any other type of wireless network. The network 104 can use protocols and components for communicating via the Internet or any of the other aforementioned types of networks. For example, the protocols used by the network 104 may include Hypertext Transfer Protocol (HTTP), HTTP Secure (HTTPS), Message Queue Telemetry Transport (MQTT), Constrained Application Protocol (CoAP), and the like. Protocols and components for communicating via the Internet or any of the other aforementioned types of communication networks are well known to those skilled in the art and, thus, are not described in more detail herein.

The one or more output device(s) 120 may include audio output devices (e.g., speakers), image output devices (e.g., displays), etc. The one or more sensor(s) 122 may include audio data sensors (e.g., microphones), image data sensors (e.g., cameras), etc. The one or more output device(s) 120 and one or more sensor(s) 122 may be located at a first location. For example, the one or more output device(s) 120 and the one or more sensor(s) 122 may be located at a same location as the first computing devices 101.

In some cases, the one or more output device(s) 120 and one or more sensor(s) 122 may be located at (e.g., hardwired at, affixed to, placed at, etc.) a particular location (e.g., a first location) to obtain sensor data associated with the particular location. For example, the location may be a room (e.g., a conference room) and the one or more output device(s) 120 and one or more sensor(s) 122 may be affixed to a wall of the room, a ceiling of the room, a table located in the room, etc.

In some cases, the one or more output device(s) 120 and/or the one or more sensor(s) 122 may be part of the first computing devices 101. For example, the one or more output device(s) 120 and/or the one or more sensor(s) 122 may be hardware components of the first computing devices 101. In another example, the first computing devices 101 may include the one or more output device(s) 120, the one or more sensor(s) 122, and/or the computing system 110.

In FIG. 1A, the first computing devices 101, the second computing devices 103, and/or the one or more sensor(s) 122 may provide sensor data (e.g., image data, audio data, etc.) to the computing system 110. The first computing devices 101, the second computing devices 103, and/or the output device(s) 120 may obtain sensor data from the computing system 110. The sensor data may be indicative of an environment of the first computing devices 101, the second computing devices 103, and/or the one or more sensor(s) 122. For example, the sensor data may indicate one or more entities located within the environment.

In some cases, the second computing devices 103 may provide sensor data to the media management system 140 and the media management system may provide the sensor data to the computing system 110, while the first computing devices 101 and the one or more sensor(s) 122 may provide sensor data directly to the computing system 110. For example, the first computing devices 101 and the one or more sensor(s) 122 may provide sensor data directly to the computing system 110 and the computing system 110 may generate an output based on the sensor data and provide the output to the media management system 140 for transmission to the second computing devices 103. In another example, the second computing devices 103 may provide sensor data to the media management system 140 which may route an output based on the sensor data to the computing system 110. The computing system 110 may process the output and provide the processed output to the first computing devices 101 and/or the output device(s) 120.

In some cases, all or a portion of the first computing devices 101, the second computing devices 103, and/or the one or more sensor(s) 122 may include a respective buffer (e.g., a respective data buffer). All or a portion of the first computing devices 101, the second computing devices 103, and/or the one or more sensor(s) 122 may write data to the buffer and write data from the buffer to a data store (e.g., a respective data store, a common data store, etc.) and/or the computing system 110. For example, all or a portion of the first computing devices 101, the second computing devices 103, and/or the one or more sensor(s) 122 may periodically or aperiodically write data to the buffer and/or write data from the buffer to the data store and/or the computing system 110 (e.g., based on a time period, a size of the data, etc.).

To enable processing of the sensor data, the computing system 110 includes a data management system 130. In some cases, the computing system 110 may be separate and/or located remotely from the data management system 130. The data management system 130 includes an audio data store 132, a metadata store 136, and a data manager 131. The data manager 131 may obtain data from and/or store data in all or a portion of the audio data store 132 and/or the metadata store 136. The audio data store 132 stores audio data 133A and audio data 133B and the metadata store 136 stores metadata 137.

The audio data 133A and/or the audio data 133B may include a portion of the sensor data provided by the first computing devices 101, the second computing devices 103, and/or the one or more sensor(s) 122. For example, the audio data 133A and/or the audio data 133B may include audio data generated by one or more audio sensors. In some cases, the first computing devices 101, the second computing devices 103, and/or the one or more sensor(s) 122 may provide the audio data 133A and the data management system 130 may generate the audio data 133B (e.g., based on the audio data 133A). In some cases, the audio data 133B may include a portion of the audio data 133A. For example, the data management system 130 may filter the audio data 133A and may identify the audio data 133B based on filtering the audio data 133A.

The metadata 137 may include data associated with the audio data 133A and/or the audio data 133B. The metadata 137 may be based on (e.g., may be generated based on) the audio data 133A and/or the audio data 133B. For example, the metadata 137 may be generated based on a shape of a waveform of the audio data 133A. As discussed herein, the metadata 137 may include and/or may indicate one or more parameters, one or more field-value pairs, one or more measurements, one or more ratings, etc.

In some cases, the metadata may include a measurement of a rate (e.g., a zero crossing rate). For example, the metadata may indicate a rate at which a signal (e.g., the audio data 133A) changes from positive to zero to negative or from negative to zero to positive. The rate may be indicative of a pitch and/or tone associated with the audio data 133A and computing system 110 may use the rate to identify a portion of the audio data 133A associated with a particular pitch and/or tone. In some cases, the computing system 110 may perform speech recognition using the rate to identify a portion of the audio data 133A associated with speech. For example, the computing system 110 may use the rate to identify a portion of the audio data 133A predicted to be representative of an environment (e.g., of speech in the environment).

In some cases, the metadata may include an amplitude (e.g., a mean square amplitude, a maximum absolute amplitude, etc.). For example, the mean square amplitude may be indicative of an average amplitude of the audio data 133A and the maximum absolute amplitude may be indicative of a maximum amplitude of the audio data 133A. The computing system 110 may use the amplitude to identify a portion of the audio data 133A associated with a largest amplitude and/or a largest average amplitude as compared to other portions of the audio data 133A. For example, the computing system 110 may use the amplitude to identify a portion of the audio data 133A predicted to be representative of an environment (e.g., of speech in the environment).

In some cases, the metadata may include a gap (e.g., a maximum gap at zero crossing). For example, the maximum gap at zero crossing may be indicative of a difference between a minimum amplitude and a minimum amplitude of the audio data 133A. The computing system 110 may use the gap to identify a portion of the audio data 133A associated with a gap that satisfies a particular threshold. For example, the computing system 110 may use the gap to identify a portion of the audio data 133A that has a gap within a threshold range or below a threshold. In another example, the computing system 110 may use the gap and the amplitude to identify a portion of the audio data 133A that has a gap within a threshold range or below a threshold and a has an amplitude that is larger than the amplitudes of other portions of the audio data 133A having a gap within the threshold range or below the threshold.

In some cases, the data management system 130 may obtain the metadata 137 from the first computing devices 101, the second computing devices 103, and/or the one or more sensor(s) 122. For example, a first computing device of the first computing devices 101 may obtain audio data 133A, generate metadata 137 based on the audio data 133A, and provide the audio data 133A and the metadata 137 to the data management system 130. In some cases, all or a portion of the first computing devices 101, the second computing devices 103, and/or the one or more sensor(s) 122 may provide a respective portion (e.g., a set) of the audio data 133A, respective image data, and/or the metadata 137 to the data management system 130.

In some cases, the data management system 130 (or a separate system) may generate the metadata 137. For example, the data management system 130 may obtain the audio data 133A, analyze the audio data 133A, and generate the metadata 137.

In some cases, the data management system 130 may include an image data store 134. In some cases, the data management system 130 may not include an image data store 134. The data manager 131 may obtain data from and/or store data in the image data store 134. The image data store 134 may store image data 135. In some cases, the metadata 137 may include data associated with the image data 135 (e.g., the metadata 137 may be generated based on the image data 135).

The image data 135 may include a portion of the sensor data provided by the first computing devices 101, the second computing devices 103, and/or the one or more sensor(s) 122. For example, the image data 135 may include image data generated by one or more image sensors. The image data 135 may include one or more image frames. For example, the image data 135 may include a single image frame, a sequence of image frames, a video, etc. In another example, the image data 135 may include one or more image frames overlaid with audio data.

In some cases, the data management system 130 may identify the first computing devices 101, the second computing devices 103, and/or the one or more sensor(s) 122. For example, the data management system 130 may identify the first computing devices 101, the second computing devices 103, and/or the one or more sensor(s) 122 as providing data to the data management system 130 (e.g., data that satisfies a threshold). In another example, the data management system 130 may identify the first computing devices 101, the second computing devices 103, and/or the one or more sensor(s) 122 based on an input (e.g., a registration, a logging in, etc.) from the first computing devices 101, the second computing devices 103, and/or the one or more sensor(s) 122. In another example, the data management system 130 may determine one or more entities associated with the first computing devices 101, the second computing devices 103, and/or the one or more sensor(s) 122 (e.g., that an entity is within a field of view of an associated image sensor) and may identify the first computing devices 101, the second computing devices 103, and/or the one or more sensor(s) 122 based on the determination.

As all or a portion of the first computing devices 101 may be capturing audio data associated with the same environment but may be misaligned (e.g., may be operating at different timings), to obtain and compare audio frames for the same time period captured by all or a portion of the first computing devices 101, data manager 131 may identify and align (e.g., synchronize) the first computing devices 101. For example, the data manager 131 may synchronize the first computing devices 101 by instructing (e.g., causing) the first computing devices 101 to synchronously flush a respective buffer (e.g., flush a respective buffer during the same time period, simultaneously, contemporaneously, etc.). In some cases, the data manager 131 may instruct the first computing devices 101 to synchronously flush a respective buffer by providing an input (e.g., a buffer command and/or time data) to the first computing devices 101. For example, the buffer command may be a command to flush a buffer of the respective computing device.

In some cases, based on the input, all or a portion of the first computing devices 101 may flush a respective buffer out of turn. For example, all or a portion of the first computing devices 101 may flush a respective buffer based on a size of the data stored in the respective buffer, a time period, etc. and, based on the input, all or a portion of the first computing devices 101 may flush a respective buffer before the size of the data satisfies (e.g., exceeds, matches, etc.) a threshold (e.g., a threshold value, a threshold range, etc.) and/or before a time period satisfies a threshold. In some cases, the input may force all or a portion of the first computing devices 101 to flush a respective buffer.

In some cases, to align the first computing devices 101, the data manager 131 may determine time data and may provide the time data to the first computing devices 101. For example, the data manager 131 may generate or obtain a time stamp and may provide the time stamp to the first computing devices 101. Based on the time stamp, all or a portion of the first computing devices 101 may time stamp audio data (e.g., using the time stamp) and may provide the audio data (e.g., time stamped audio data) to the data manager 131.

In some cases, to align the first computing devices 101, the data manager 131 may provide a buffer command to the first computing devices 101. For example, the buffer command may include a command to flush a corresponding buffer. In response to the buffer command, all or a portion of the first computing devices 101 may flush a corresponding buffer and provide audio data to the data manager 131.

As discussed herein, the data manager 131 may obtain audio data 133A from the first computing devices 101 based on aligning the first computing devices 101. In some cases, the data manager 131 may obtain metadata from the first computing devices 101 (e.g., with or separate from the audio data 133A).

Based on receiving the audio data 133A, the data manager 131 may align (e.g., temporally) the audio data 133A and filter a portion of the audio data 133A. The data manager 131 may dynamically select portions of the audio data 133A (e.g., the aligned audio data) based on the metadata 137 and may generate audio data 133B based on dynamically selecting portions of the audio data. The data manager 131 may use the metadata 137 to identify, for all or a portion of a plurality of time periods, a portion of the audio data 133A with a greater quality (e.g., lower feedback, higher amplitude, indicative of a voice, lower background noise, etc.) as compared to other portions of the audio data 133A associated with the same time period. For example, the data manager 131 may use the metadata 137 to identify and dynamically select a portion of the audio data 133A with a greatest amplitude as compared to other portions of the audio data 133A associated with the same time period. In another example, the data manager 131 may use the metadata 137 to identify a portion of the audio data 133A that has a gap within a threshold range or below a threshold and a has an amplitude that is larger than the amplitudes of other portions of the audio data 133A associated with the same time period and having a gap within the threshold range or below the threshold. The data manager 131 may generate an output based on the audio data 133B and may provide the output to the output device(s) 120, the second computing devices 103, and/or the media management system 140.

Figure 1B:
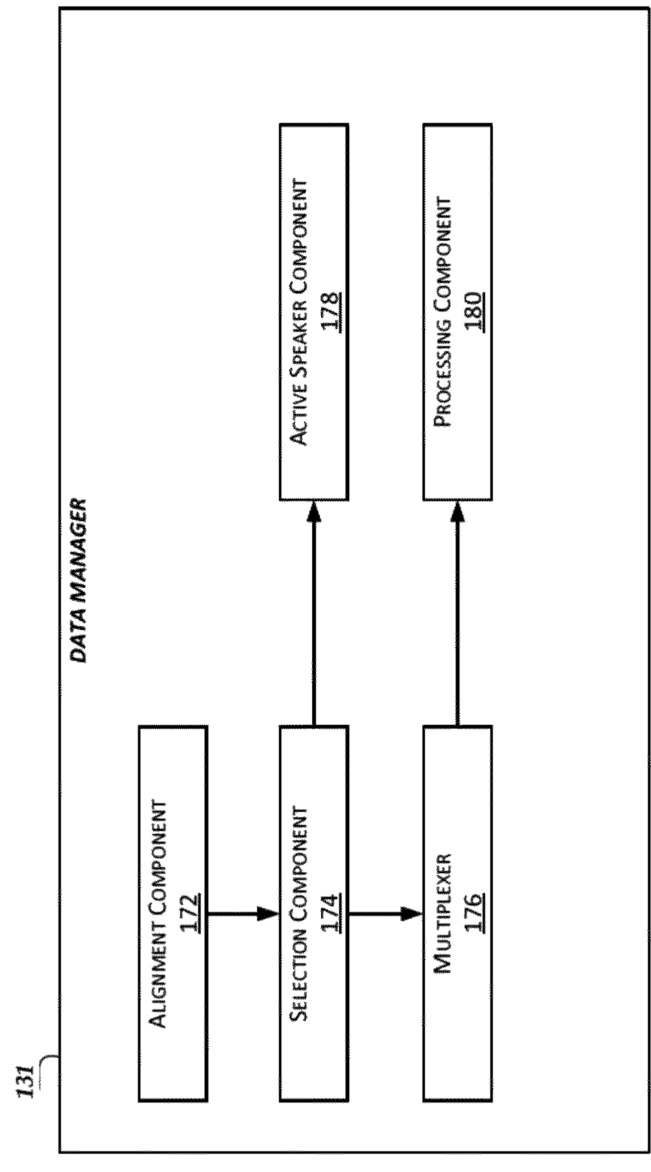
FIG. 1B is a block diagram depicting an illustrative environment in which a data manager of the data management system of FIG. 1A can process data obtained from and/or to be routed to computing devices.

FIG. 1B is a block diagram of an illustrative operating environment 100B in which a data manager 131 operates (e.g., the data manager 131 discussed herein with reference to FIG. 1A). As shown in FIG. 1B, the data manager 131 includes and implements an alignment component 172, a selection component 174, a multiplexer 176, an active speaker component 178, and a processing component 180. It will be understood that the data manager 131 may include more, less, or different components. For example, the data manager 131 may not include an active speaker component. In some cases, a separate system or a separate component (e.g., a separate component of the data management system) may include and/or may implement one or more of the alignment component 172, the selection component 174, the multiplexer 176, the active speaker component 178, and/or the processing component 180.

The alignment component 172 may obtain the audio data and align the audio data (e.g., based on aligning the first computing devices 101). To align the audio data, the alignment component 172 may determine for all or a portion of the audio data if the audio data satisfies a threshold. For example, the alignment component 172 may determine whether a time associated with the audio data corresponds to the time data, whether a size of the audio data corresponds to a size threshold, etc. Based on determining that a portion of the audio data does not satisfy a threshold (e.g., a time associated with the portion of the audio data does not correspond to the time data), the alignment component 172 may filter out the portion of the audio data to generate aligned audio data (e.g., filtered audio data). The alignment component 172 may provide the aligned audio data to the selection component 174.

The selection component 174 may dynamically select, for each time period of a plurality of time periods, an audio frame from the audio data (e.g., the aligned audio data). For example, the audio data may include a respective plurality of audio frames for each time period of the plurality of time periods and the selection component 174 may select, for each time period, an audio frame from the respective plurality of audio frames. The selection component 174 may dynamically select an audio frame in that the selection component 174 may select any audio frame for a respective time period from the respective plurality of audio frames associated with the respective time period. Further, each audio frame from the respective plurality of audio frames may be dynamically selectable for the respective time period. Each audio frame of the respective plurality of audio frames may be associated with a particular computing devices of the first computing devices 101. For example, a respective plurality of audio frames may include a first audio frame associated with a first time period and obtained from a first computing device, a second audio frame associated with a second time period and obtained from a second computing device, etc.

The selection component 174 may dynamically select the audio frame based on the respective metadata associated with each of the respective plurality of audio frames. For example, the selection component 174 may select an audio frame with a greatest amplitude (e.g., as identified by the metadata) as compared to other audio frames. In another example, the selection component 174 may select an audio frame with a greatest amplitude as compared to other audio frames while also not satisfying a threshold (e.g., the amplitude not satisfying a threshold, a gap of the audio frame not satisfying the threshold, etc.). In some cases, the selection component 174 may select an audio frame based on comparing a first set of metadata associated with a first audio frame to a second set of metadata associated with a second audio frame. In some cases, the selection component 174 may select an audio frame based on comparing a set of metadata associated with an audio frame to a threshold.

Based on dynamically selecting, for each time period of a plurality of time periods, an audio frame, the selection component 174 may identify and/or generate audio data (e.g., a set of audio frames). For example, the selection component 174 may generate audio data by filtering the audio data (e.g., filtering out non-selected audio frames). The selection component 174 may provide the audio data to the active speaker component 178 and the multiplexer 176.

The multiplexer 176 may obtain the audio data and may generate an audio stream based on the audio data. For example, the multiplexer 176 may generate a continuous audio stream based on the audio data. In some cases, to generate the audio stream, the multiplexer 176 may interleave (e.g., mix, insert, etc.) the audio data within the audio stream. The multiplexer 176 may provide the audio stream to the processing component 180. In some cases, the multiplexer 176 may provide the audio stream as an output to a second computing device.

In some cases, the processing component 180 may obtain the audio stream, process the audio stream, and provide an output. For example, the processing component 180 may perform noise suppression (e.g., background noise suppression), gain control (e.g., automatic gain control), and/or echo cancellation. As the first computing devices 101 may be located in the same environment (e.g., the same room), the audio stream may include an echo, may include noise, may be a weak signal, may be a strong signal, etc. Therefore, to improve a user experience, the processing component 180 may process the sensor data by performing noise suppression, gain control, echo cancellation, etc. The processing component 180 may provide the processed audio stream as an output to a second computing device.

In some cases, the processing component 180 may process the audio stream based on audio data from all or a portion of the first computing devices 101. For example, the processing component 180 may use audio data not included within the audio stream to identify an echo, a gain, and/or noise and may process the audio stream to suppress the noise, adjust the audio stream according to the gain, and/or cancel the echo. While the audio data may not be included within the audio stream (e.g., due to a speaker being located closer to a different computing device), the audio data not included within the audio stream may be indicative of an echo, a gain, and/or noise and the processing component 180 may use the audio data to process the audio stream.

In some cases, the processing component 180 may provide the output and/or indication of the processed audio stream (e.g., an indicator of the echo, the gain, the background noise, etc.) to all or a portion of the first computing devices 101.

The active speaker component 178 may obtain the metadata and/or audio data. For example, the audio data may include all or a portion of the audio data provided to the multiplexer 176. In another example, the audio data may include additional audio data obtained from the first computing devices 101 (e.g., different audio data as compared to the audio data provided to the alignment component 172, the selection component 174, and/or the multiplexer 176). In another example, the audio data may include audio data obtained from one or more third computing devices.

Based on the metadata and/or the audio data, the active speaker component 178 may perform active speaker identification to identify an entity (and a persona) associated with the sensor data. For example, the active speaker component 178 may provide the sensor data to a machine learning model (e.g., implemented by the active speaker component 178) that is trained to output an identifier of a particular entity and/or computing device associated with the sensor data. The computing system may provide an identifier (e.g., a watermark, a border, etc. relative to image data) of the active speaker to the one or more third computing devices. For example, the computing system may cause display of the identifier.

Figure 2:
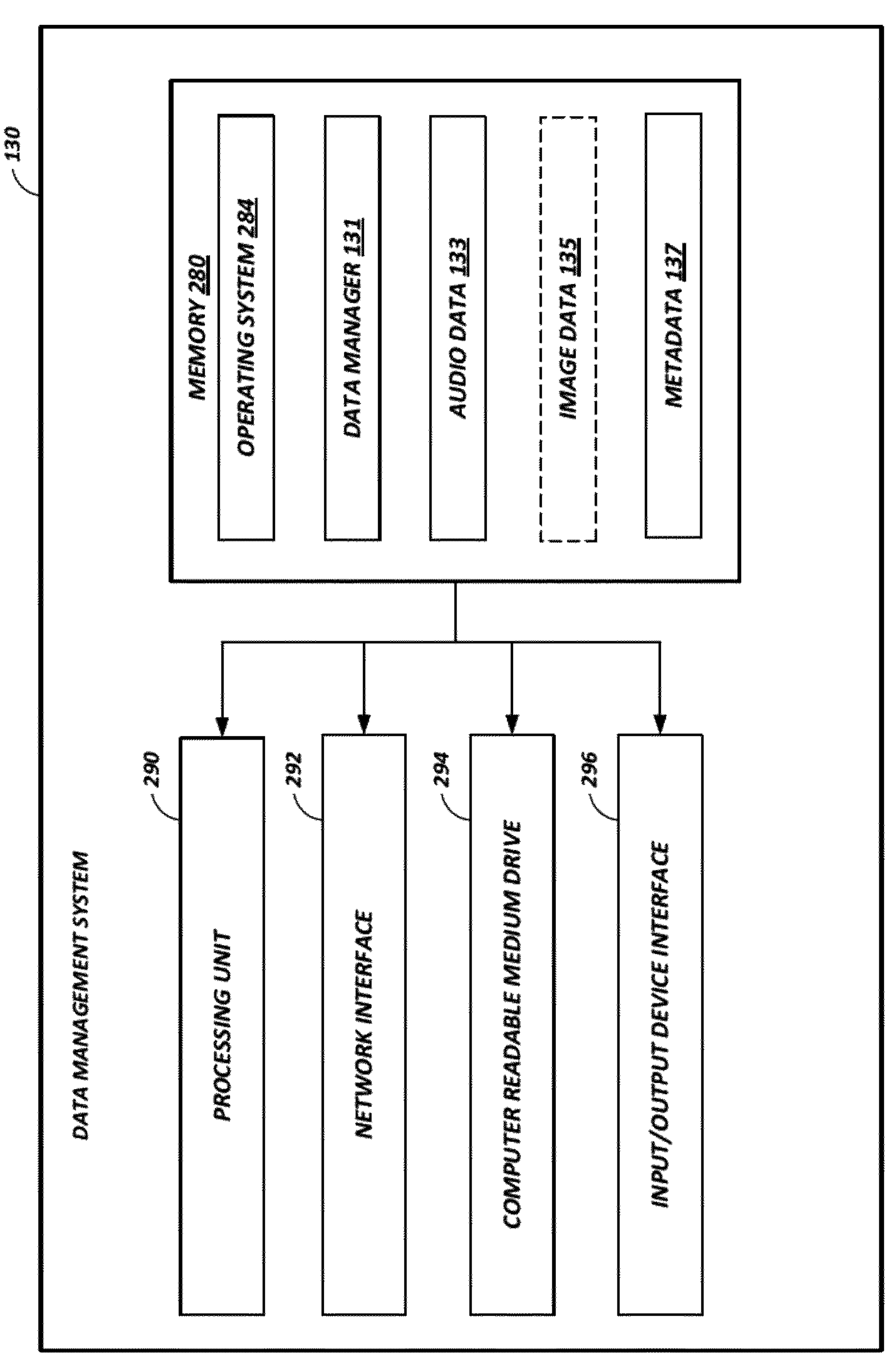
FIG. 2 depicts a general architecture of a computing device or system providing a data management system that can process data obtained from and/or to be routed to computing devices and manage assignment of personas to entities.

FIG. 2 depicts a general architecture of a computing system (referenced as data management system 130) that operates to manage (e.g., route) sensor data associated with a conference. The general architecture of the data management system 130 depicted in FIG. 2 includes an arrangement of computer hardware and software modules that may be used to implement aspects of the present disclosure. For example, aspects of the present disclosure may be implemented by computer hardware modules (e.g., a processor, a processing device, a computing device, etc.) or may be implemented via software modules. In some cases, one or more first aspects of the present disclosure may be implemented by computer hardware modules and one or more second aspects of the present disclosure may be implemented via software modules. The hardware modules may be implemented with physical electronic devices. The data management system 130 may include many more (or fewer) elements than those shown in FIG. 2. It is not necessary, however, that all of these generally conventional elements be shown in order to provide an enabling disclosure. Additionally, the general architecture illustrated in FIG. 2 may be used to implement one or more of the other components illustrated in FIG. 1A.

As illustrated, the data management system 130 includes a processing unit 290, a network interface 292, a computer readable medium drive 294, and an input/output device interface 296, all of which may communicate with one another by way of a communication bus. The network interface 292 may provide connectivity to one or more networks or computing systems. The processing unit 290 may thus receive information and instructions from other computing systems or services via the network 104. The processing unit 290 may also communicate to and from memory 280 and further provide output information for an optional display (not shown) via the input/output device interface 296. The input/output device interface 296 may also accept input from an optional input device (not shown).

The memory 280 may contain computer program instructions (grouped as units in some embodiments) that the processing unit 290 executes in order to implement one or more aspects of the present disclosure, along with data used to facilitate or support such execution. While shown in FIG. 2 as a single set of memory 280, memory 280 may in practice be divided into tiers, such as primary memory and secondary memory, which tiers may include (but are not limited to) RAM, 3D XPOINT memory, flash memory, magnetic storage, and the like. For example, primary memory may be assumed for the purposes of description to represent a main working memory of the data management system 130, with a higher speed but lower total capacity than a secondary memory, tertiary memory, etc.

The memory 280 may store an operating system 284 that provides computer program instructions for use by the processing unit 290 in the general administration and operation of the data management system 130. The memory 280 may further include computer program instructions and other information for implementing aspects of the present disclosure. For example, in one embodiment, the memory 280 includes a data manager 131 to manage the data as described above. The memory 280 also includes audio data 133 and metadata 137. In some cases, the memory 280 may include image data 135. The audio data 133, the image data 135, and/or the metadata 137 may be cached locally to the data management system 130, such as in the form of a memory mapped file. For example, the data management system 130 may obtain the audio data 133, the image data 135, and/or the metadata 137 and store the audio data 133, the image data 135, and/or the metadata 137 in memory 280.

The data management system 130 of FIG. 2 is one illustrative configuration of such a device, of which others are possible. For example, while shown as a single device, the data management system 130 may in some embodiments be implemented as a logical device hosted by multiple physical host devices. In other embodiments, the data management system 130 may be implemented as one or more virtual devices executing on a physical computing device. While described in FIG. 2 as the data management system 130, similar components may be utilized in some embodiments to implement other devices shown in the environment 100 of FIG. 1A.

As discussed above, the first computing devices 101, the second computing devices 103, the output device(s) 120, and/or the sensor(s) 122 may be implemented to conduct a conference. The first computing devices 101, the output device(s) 120, and/or the sensor(s) 122 may be located at a first location (e.g., in a conference room) associated with the conference (e.g., an origin, a homebase, a central point, etc. of the conference) and the second computing devices 103 may be located at one or more second locations (e.g., may be located remotely from the first location). In some cases, the first location may be the location of the computing system 110.

Figure 3:
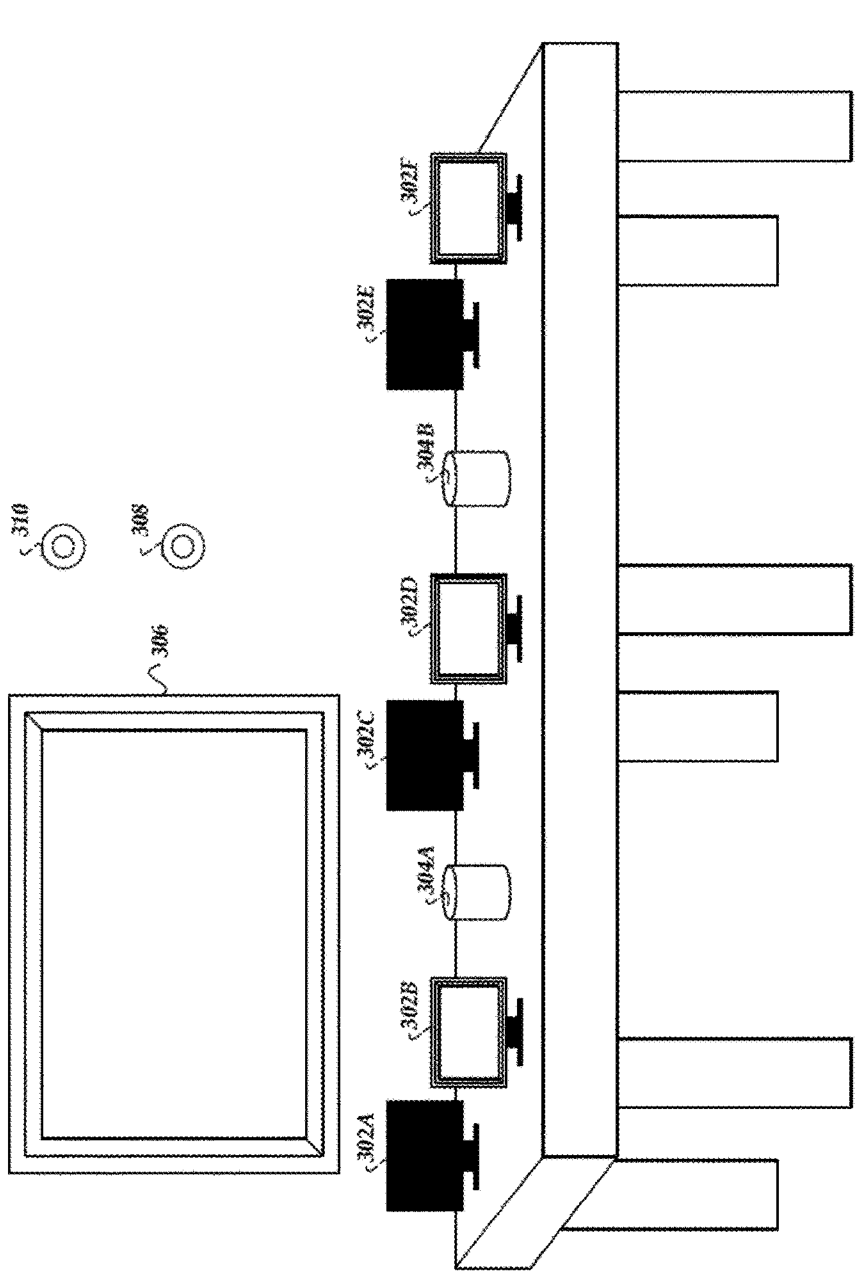
FIG. 3 is a pictorial diagram of an example environment including a plurality of computing devices, sensors, and output devices.

To illustrate how the first computing devices 101, the output device(s) 120, and/or the sensor(s) 122 may be located at the first location, FIG. 3 is a pictorial diagram of an example environment 300 including a plurality of devices to obtain sensor data and provide an output (e.g., to an entity). The plurality of devices may be similar to the first computing devices 101, the output device(s) 120, and/or the sensor(s) 122 as discussed above with reference to FIG. 1A. The plurality of devices may be modular such that the devices can be removed, added, or modified in real time on demand.

The plurality of devices located in the environment 300 may include computing devices 302A, 302B, 302C, 302D, 302E, and 302F, computing systems 304A and 304B, output device 306, and sensors 308 and 310. In some cases, all or a portion of the computing devices 302A, 302B, 302C, 302D, 302E, and 302F and/or the computing systems 304A and 304B may include one or more output devices and/or sensors. Further, the output device 306 may include one or more sensors and the sensors 308 and 310 may include one or more output devices.

As discussed above, all or a portion of the computing devices 302A, 302B, 302C, 302D, 302E, and 302F, the computing systems 304A and 304B, the output device 306, and the sensors 308 and 310 may be located within the environment 300. For example, the environment 300 may be a conference room. All or a portion of the computing devices 302A, 302B, 302C, 302D, 302E, and 302F, the computing systems 304A and 304B, the output device 306, and the sensors 308 and 310 may be affixed to the environment 300, affixed to an object (e.g., a wall, a table, a ceiling, etc.) in the environment 300, placed in the environment 300, hardwired within the environment 300, mounted within the environment 300, etc. In some cases, all or a portion of the computing devices 302A, 302B, 302C, 302D, 302E, and 302F, the computing systems 304A and 304B, the output device 306, and the sensors 308 and 310 may be mounted within the environment 300 using one or more hardware mounts, stands, etc.

As discussed above, all or a portion of the computing devices 302A, 302B, 302C, 302D, 302E, and 302F may be user computing devices (e.g., tablets). All or a portion of the computing devices 302A, 302B, 302C, 302D, 302E, and 302F may include one or more sensors (e.g., image sensors, audio sensors, etc.) and/or output devices (e.g., microphones, displays, etc.) to obtain sensor data. The environment 300 may include more, less, or different computing devices.

The output device 306 may provide an output. For example, the output device 306 may include an audio output device (e.g., a microphone) to output audio and/or an image output device (e.g., a display) to output images (e.g., image frames, videos, etc.). The output device 306 may obtain data from one or more of the computing systems 304A and 304B and provide the output. The environment 300 may include more, less, or different output devices.

The sensors 308 and 310 may obtain sensor data. For example, the sensors 308 and 310 may include an audio sensor to obtain audio data and/or an image sensor to obtain image data. The sensors 308 and 310 may route the sensor data to one or more of the computing systems 304A and 304B. The environment 300 may include more, less, or different sensors.

The computing systems 304A and 304B may be similar to and/or may include or may implement the computing system 110 as discussed above with reference to FIG. 1A. In some cases, the computing system 304A may be a primary computing system and the computing system 304B may be a backup computing system. In some cases, the computing system 304A and the computing system 304B may perform different functions. For example, the computing system 304A may obtain, process, and route data associated with a first subset of the computing devices 302A, 302B, 302C, 302D, 302E, and 302F, the output device 306, and/or the sensors 308 and 310 and the computing system 304B may obtain, process, and route data associated with a second subset of the computing devices 302A, 302B, 302C, 302D, 302E, and 302F, the output device 306, and/or the sensors 308 and 310. In some cases, the computing system 304A and 304B may share compute resources (e.g., memory) to obtain, process, and route data associated with the computing devices 302A, 302B, 302C, 302D, 302E, and 302F, the output device 306, and/or the sensors 308 and 310. The environment 300 may include more, less, or different computing systems.

All or a portion of the computing devices 302A, 302B, 302C, 302D, 302E, and 302F may obtain an output from and route sensor data to the computing systems 304A and 304B. For example, all or a portion of the computing devices 302A, 302B, 302C, 302D, 302E, and 302F may have a hardwire connection to the computing systems 304A and 304B. In some cases, the hardwire connection between the computing devices 302A, 302B, 302C, 302D, 302E, and 302F and the computing systems 304A and 304B, power connections for the computing devices 302A, 302B, 302C, 302D, 302E, and 302F, and/or network connections for the computing devices 302A, 302B, 302C, 302D, 302E, and 302F may be routed within mounts for the computing devices 302A, 302B, 302C, 302D, 302E, and 302F such that cables for the computing devices 302A, 302B, 302C, 302D, 302E, and 302F are not plainly visible to the human eye. Therefore, all or a portion of the computing devices 302A, 302B, 302C, 302D, 302E, and 302F may route sensor data to the computing systems 304A and 304B.

In some cases, the computing devices 302A, 302B, 302C, 302D, 302E, and 302F may be connected to the computing systems 304A and 304B via a hub (e.g., a universal serial bus ("USB") hub). Further, the computing devices 302A, 302B, 302C, 302D, 302E, and 302F may be connected to a switch (e.g., a network switch).

As discussed above, the computing systems 304A and 304B may synchronize the computing devices 302A, 302B, 302C, 302D, 302E, and 302F, and/or the sensors 308 and 310 and/or the data to be routed to the computing devices 302A, 302B, 302C, 302D, 302E, and 302F, and/or the output device 306. Based on the synchronization, the computing systems 304A and 304B may obtain sensor data from the computing devices 302A, 302B, 302C, 302D, 302E, and 302F, and/or the sensors 308 and 310 and/or route an output to the computing devices 302A, 302B, 302C, 302D, 302E, and 302F, and/or the output device 306. In some cases, the computing system 304A and 304B may obtain sensor data from one or more sensors of the computing systems 304A and 304B (e.g., one or more audio sensors of the computing systems 304A and 304B). For example, the sensor data may be indicative of audio within the environment 300, an image of the environment 300, audio output by the computing devices 302A, 302B, 302C, 302D, 302E, and 302F, and/or the output device 306, an image displayed via a display of the computing devices 302A, 302B, 302C, 302D, 302E, and 302F, and/or the output device 306 (e.g., screen share data).

The computing systems 304A and 304B may process the sensor data obtained from the computing devices 302A, 302B, 302C, 302D, 302E, and 302F, and/or the sensors 308 and 310 and/or the data to be routed to the computing devices 302A, 302B, 302C, 302D, 302E, and 302F, and/or the output device 306. To process the sensor data, the computing systems may filter, normalize, transform, adjust, encode (e.g., using an encoder of the computing systems 304A and 304B), synchronize, etc. the sensor data. For example, the computing systems 304A and 304B may process the sensor data by filtering the sensor data (e.g., based on a selection of an audio frame for each time period), performing echo cancellation on the sensor data, performing automatic gain control on the sensor data, suppressing background noise from the sensor data, etc.

Based on processing the sensor data, the computing systems 304A and 304B may generate an output (e.g., processed sensor data). In some cases, the output may include a continuous audio stream. The computing systems 304A and 304B may generate the output and provide the output to a media management system for transmission to one or more devices (e.g., one or more computing devices, one or more sensors, one or more output devices, etc.). In some embodiments, the computing systems 304A and 304B may provide the output directly to one or more devices (e.g., remote devices). In some cases, the computing systems 304A and 304B may not provide the output to the computing devices 302A, 302B, 302C, 302D, 302E, and 302F and/or the sensors 308 and 310. The output may include an image output (e.g., an output of a single image frame, an output of a video, etc.), an audio output, etc. associated with the out-of-room conference attendee.

In some cases, the output may include instructions to display image data and/or output audio data. For example, the computing systems 304A and 304B may instruct (e.g., cause) display of image data and/or output of audio data.

Figure 4:
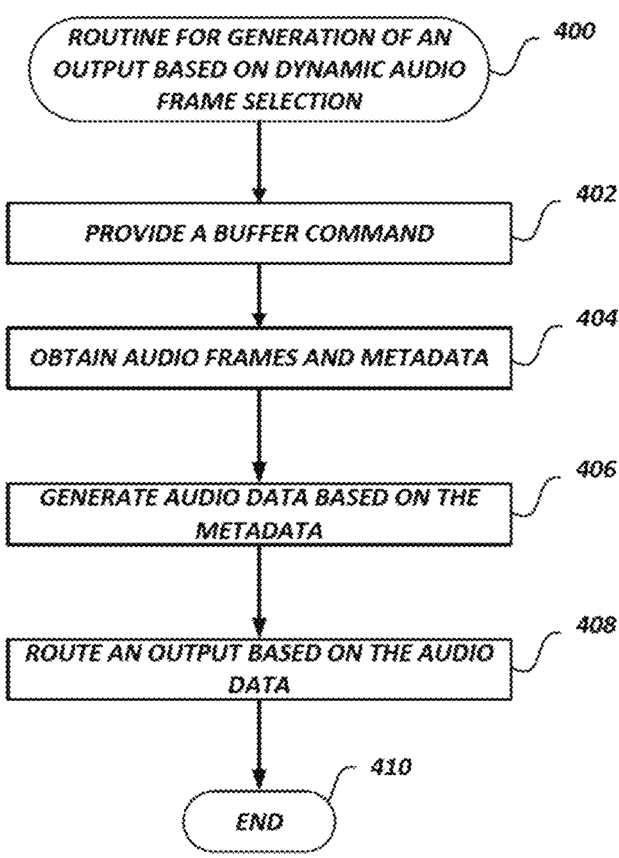
FIG. 4 depicts an illustrative routine for generating an output based on dynamic audio frame selection.

As discussed above, a computing system may generate an output based on a dynamic selection of audio frames. In some cases, the computing system may dynamically select an audio frame for a particular time period from a plurality of audio frames obtained from a plurality of computing devices and may ignore the non-selected audio frames. With reference to FIG. 4, an illustrative routine 400 will be descried for generation of an output based on the dynamic audio frame selection. The routine 400 may be implemented for example, by the computing system 110 of FIG. 1A (e.g., which may include a computing device, data processing hardware, memory, etc.). In some cases, the routine 400 may be implemented by a processor. The routine 400 begins at block 402, where the computing system provides a buffer command (e.g., to a plurality of first computing devices). For example, the computing system may provide the buffer command to a first computing device and a second computing device.

In some cases, prior to providing the buffer command to the plurality of first computing devices, the computing system may identify the plurality of first computing devices (e.g., including one or more microphones to obtain audio data, one or more displays, one or more speakers, one or more image sensors, etc.). For example, the computing system may identify the plurality of first computing devices as located within a first environment. In another example, the computing system may identify the plurality of first computing devices as providing data (e.g., audio data) to the computing system. In another example, the computing system may identify a plurality of first computing devices are associated with metadata that satisfies a threshold (e.g., the metadata indicates a rate that matches or exceeds a threshold). Based on identifying the plurality of first computing devices, the computing system may provide the buffer command to the plurality of first computing devices.

In some cases, the computing system may determine first time data (e.g., a time stamp) and may provide the buffer command based on the first time data. For example, the first time data may indicate a time to implement the buffer command, a time stamp for stamping audio data, etc. In some cases, the computing system may determine first time data (e.g., a time stamp) and may provide the first time data.

In some cases, in response to receiving the buffer command and/or the first time data, all or a portion of the plurality of first computing devices may flush (e.g., synchronously flush) a respective buffer (e.g., audio buffer) associated with the respective computing device (e.g., a buffer located at or on the respective computing device) based on the buffer command. For example, a first computing device of the plurality of first computing devices may flush a first buffer based on the buffer command and a second computing device of the plurality of first computing devices may flush a second buffer based on the buffer command.

Based on providing the buffer command, at block 404, the computing system obtains audio frames and metadata. In some cases, the computing system may obtain the audio frames and the metadata as a plurality of sets of audio data and a plurality of sets of metadata. For example, the computing system may obtain a plurality of sets of audio data (e.g., a plurality of first sets of audio data) and a plurality of sets of metadata. The computing system may obtain a respective set of audio data and a respective set of metadata from all or a portion of the plurality of first computing devices (e.g., in response to providing the buffer command to all or a portion of the plurality of first computing devices). For example, the computing system may obtain a first set of audio data (e.g., a first set of audio frames) and a first set of metadata from a first computing device and may obtain a second set of audio data (e.g., a second set of audio frames) and a second set of metadata from a second computing device.

All or a portion of the plurality of sets of audio data may include a respective plurality of audio frames. Further, all or a portion of the plurality of sets of audio data may include a respective audio frame for each time period of a plurality of time periods.

The metadata may identify and/or may indicate one or more of a rate, a gap, or an amplitude associated with an associated audio frame of the audio frames. For example, the metadata may indicate an amplitude of the audio frames. In some cases, the metadata may be based on a shape of one or more associated audio frames. In some cases, the computing system may generate the metadata (e.g., based on the obtained audio data). In some cases, the plurality of first computing devices or a separate system may generate the metadata.

In some cases, the computing system may determine that the audio data is aligned (e.g., temporally aligned within a particular threshold). For example, the computing system may verify an alignment of one or more audio frames associated with a first computing device with one or more audio frames associated with a second computing device. In some cases, the computing device may determine that one or more audio frames (e.g., one or more audio frames associated with a fourth computing device) are misaligned with one or more other audio frames (e.g., one or more audio frames associated with a first computing device, one or more audio frames associated with a second computing device, etc.). Based on determining that the one or more audio frames are misaligned, the computing system may filter (e.g., drop, ignore, etc.) the one or more audio frames (e.g., or a portion of the one or more audio frames).

Using the obtained audio frames (e.g., the filtered audio frames), at block 406, the computing system generates audio data based on the metadata. The computing system may generate the audio data based on the audio frames obtained from the plurality of first computing devices (e.g., a first set of audio frames provided by a first computing device and a second set of audio frames provided by a second computing device).

In some cases, to generate the audio data, the computing system may identify and dynamically select, based on the metadata, for each time period of the plurality of time periods, a respective audio frame from a plurality of the audio frames associated with the respective time period and all or a portion of the plurality of first computing devices. The computing system may use the metadata to identify and dynamically select, for each time period of the plurality of time periods, a respective audio frame predicted to have a greater quality (e.g., lower feedback, lower echo, adjusted amplification, lower background noise, indicative of a voice, etc.) as compared to a plurality of the audio frames associated with the same time period.

In some cases, to generate the audio data, the computing system may compare the metadata (e.g., with other metadata, with a threshold, etc.) to identify and dynamically select a respective audio frame. For example, the computing system may compare a first set of metadata associated with a first audio frame obtained from a first computing device of the plurality of first computing devices and a second set of metadata associated with a second audio frame obtained from a second computing device of the plurality of first computing devices. To compare the metadata, the computing system may compare a first value of the metadata associated with a first audio frame and a second value of the metadata associated with a second audio frame to determine to determine which of the values is larger (e.g., which of the first value or the second value indicates a greater amplitude).

In one example of comparing the metadata, the computing system may determine that the volume of a first audio frame associated with a first time period exceeds a volume of a second audio frame associated with the audio frame associated with the first time period. Based on determining that the volume of the first audio frame exceeds the volume of the second audio frame, the computing system may identify and dynamically select the first audio frame and may not select the second audio frame.

In another example of comparing the metadata, the computing system may determine that a gap associated with the first audio frame (e.g., a difference between two or more values associated with the first audio frame) satisfies a threshold (e.g., is equal to, exceeds, etc. the threshold). Based on determining that the gap associated with the first audio frame satisfies the threshold, the computing system may identify and dynamically select the second audio frame and may not select the first audio frame (e.g., which may be associated with a volume that exceeds a volume of the second audio frame).

The computing system may determine a set of audio frames (e.g., a third set of audio frames) based on the identification and dynamic selection of audio frames. The set of audio frames may include audio frames provided by two or more computing devices (e.g., the set of audio frames may include an audio frame from a set of audio frames provided by a first computing device and an audio frame from a set of audio frames provided by a second computing device). The computing system may determine the audio data (e.g., a second set of audio data) based on the selected set of audio frames.

The audio data may include at least one respective audio frame obtained from all or a portion of the plurality of first computing devices. For example, the audio data may include a first audio frame for a first time period and obtained from a first computing device, a second audio frame for a second time period and obtained from a second computing device, etc.

To provide a representation of the audio data, at block 408, the computing system routes an output based on the audio data. The computing system may route the output to one or more second computing devices (e.g., one or more second computing devices that are remote from the plurality of first computing devices). For example, the computing system may instruct output of the output.

In some cases, the computing system may generate a continuous audio stream based on the audio data and may generate an output based on the continuous audio stream. For example, the computing system may interleave the audio frames of the audio data into a continuous audio stream and may generate an output that includes the continuous audio stream. In some cases, the computing system may generate the output using a multiplexer.

In some cases, to generate the output, the computing system may process one or more of the audio data or the continuous audio stream and may generate an output based on processing the one or more of the audio data or the continuous audio stream. For example, the computing system may perform one or more of noise suppression, automatic gain control, or echo cancellation relative to the audio data and/or the continuous audio stream and may generate the output.

In some cases, the computing system may determine an active speaker based on audio data (e.g., the audio data generated by the computing system, the audio data and/or additional obtained from the plurality of first computing devices, additional audio data obtained from a third computing device, etc.). The computing system may determine an identifier of the active speaker and may route the identifier to the one or more second computing devices. The routine 400 then ends at block 410.

In various embodiments, the routine 400 may include more, fewer, different, or different combinations of blocks than those depicted in FIG. 4. For example, the routine 400 may, in some embodiments, may not include routing of an output based on the audio data. As a further example, block 402 may be omitted, in some cases, such that the data management system does not provide the buffer command. The routine 400 depicted in FIG. 4 is thus understood to be illustrative and not limiting.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules, including one or more specific computer-executable instructions, that are executed by a computing system. The computing system may include one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might," or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B, and C" can include a first processor configured to carry out recitation A working in conjunction with a second processor configured to carry out recitations B and C.

What is claimed is:

1. A system comprising:

data processing hardware; and memory in communication with the data processing hardware, the memory storing instructions that when executed on the data processing hardware cause the data processing hardware to:

identify a plurality of first computing devices located within a first environment;

provide a buffer command to the plurality of first computing devices, wherein each computing device of the plurality of first computing devices is configured to synchronously flush a respective buffer based on the buffer command;

obtain, from the plurality of first computing devices, a plurality of first sets of audio data and associated metadata based on the buffer command, wherein each first set of audio data of the plurality of first sets of audio data comprises a respective audio frame for each time period of a plurality of time periods;

dynamically select, for each time period of the plurality of time periods, a respective audio frame from the plurality of first sets of audio data based on the associated metadata;

determine a second set of audio data based on dynamically selecting, for each time period of the plurality of time periods, the respective audio frame, wherein the second set of audio data comprises at least one respective audio frame obtained from each first computing device of the plurality of first computing devices;

generate a continuous audio stream based on the second set of audio data;

perform one or more of noise suppression, automatic gain control, or echo cancellation to the continuous audio stream and subsequently generate an output; and route the output to one or more second computing devices located within a second environment.

2. The system of claim 1, wherein execution of the instructions on the data processing hardware further causes the data processing hardware to:

determine an active speaker based on one or more of the plurality of first sets of audio data or a plurality of third sets of audio data obtained from the plurality of first computing devices; and route an identifier of the active speaker to the one or more second computing devices.

3. The system of claim 1, wherein each first computing device of the plurality of first computing devices comprises:

a respective microphone to obtain a respective first set of audio data.

4. The system of claim 1, wherein the associated metadata indicates one or more of a rate, a gap, or an amplitude associated with a respective audio frame of the plurality of first sets of audio data.

5. A method comprising:

providing a buffer command to a first computing device and a second computing device to cause the first computing device to flush a first buffer based on the buffer command and to cause the second computing device to flush a second buffer based on the buffer command;

obtaining, from the first computing device, a first set of audio frames and a first set of metadata subsequent to providing the buffer command to the first computing device, wherein the first set of audio frames comprises, for each time period of a plurality of time periods, a respective audio frame of the first set of audio frames;

obtaining, from the second computing device, a second set of audio frames and a second set of metadata subsequent to providing the buffer command to the second computing device, wherein the second set of audio frames comprises, for each time period of the plurality of time periods, a respective audio frame of the second set of audio frames;

identifying, for each time period of the plurality of time periods, a respective audio frame from the first set of audio frames and the second set of audio frames based on the first set of metadata and the second set of metadata;

determining a third set of audio frames based on identifying, for each time period of the plurality of time periods, the respective audio frame from the first set of audio frames and the second set of audio frames, wherein the third set of audio frames comprises a particular audio frame of the first set of audio frames and a particular audio frame of the second set of audio frames;

generating a continuous audio stream based on the third set of audio frames; and routing an output based on the continuous audio stream to one or more of the first computing device, the second computing device, or a third computing device.

6. The method of claim 5, further comprising:

comparing the first set of metadata and the second set of metadata, wherein identifying, for each time period of the plurality of time periods, the respective audio frame from the first set of audio frames and the second set of audio frames is based on comparing the first set of metadata and the second set of metadata.

7. The method of claim 5, further comprising:

comparing the first set of metadata and the second set of metadata; and determining a volume associated with a first audio frame of the first set of audio frames exceeds a volume associated with a second audio frame of the second set of audio frames based on comparing the first set of metadata and the second set of metadata, wherein identifying, for each time period of the plurality of time periods, the respective audio frame from the first set of audio frames and the second set of audio frames comprises identifying the first audio frame based on determining the volume associated with the first audio frame exceeds the volume associated with the second audio frame.

8. The method of claim 5, further comprising:

comparing the first set of metadata and the second set of metadata;

determining a volume associated with a first audio frame of the first set of audio frames exceeds a volume associated with a second audio frame of the second set of audio frames based on comparing the first set of metadata and the second set of metadata; and determining a gap associated with the first audio frame satisfies a threshold, wherein identifying, for each time period of the plurality of time periods, the respective audio frame from the first set of audio frames and the second set of audio frames comprises identifying the second audio frame based on determining the gap satisfies the threshold.

9. The method of claim 5, wherein the first set of metadata is based on a shape of the first set of audio frames, and wherein the second set of metadata is based on a shape of the second set of audio frames.

10. The method of claim 5, wherein generating the continuous audio stream comprises generating the continuous audio stream using a multiplexer.

11. The method of claim 5, further comprising:

determining that the first set of audio frames and the second set of audio frames are aligned.

12. The method of claim 5, further comprising:

obtaining, from a fourth computing device, a fourth set of audio frames and a third set of metadata, wherein the fourth set of audio frames comprises, for each time period of the plurality of time periods, a respective audio frame of the second set of audio frames; and determining the fourth set of audio frames are misaligned with one or more of the first set of audio frames or the second set of audio frames, wherein generating the continuous audio stream is further based on determining the fourth set of audio frames are misaligned with the one or more of the first set of audio frames or the second set of audio frames.

13. The method of claim 5, further comprising:

determining an active speaker based on the first set of audio frames, the first set of metadata, the second set of audio frames, and the second set of metadata; and routing, to the third computing device, an identifier of the active speaker.

14. The method of claim 5, further comprising:

obtaining, from a fourth computing device, a fourth set of audio frames;

determining an active speaker based on the first set of audio frames, the first set of metadata, the second set of audio frames, and the second set of metadata; and routing, to the third computing device, an identifier of the active speaker.

15. Non-transitory computer-readable media including computer-executable instructions that, when executed by a processor, cause the processor to:

provide a buffer command to a first computing device and a second computing device;

obtain, from the first computing device, a first audio frame and a first set of metadata subsequent to providing the buffer command to the first computing device;

obtain, from the second computing device, a second audio frame and a second set of metadata subsequent to providing the buffer command to the second computing device;

generate, from the first audio frame and the second audio frame, audio data based on the first set of metadata and the second set of metadata, wherein the audio data comprises the first audio frame or the second audio frame; and route an output based on the audio data to one or more of the first computing device, the second computing device, or a third computing device.

16. The non-transitory computer-readable media of claim 15, wherein the first computing device clears a buffer of the first computing device in response to the buffer command, and wherein the second computing device clears a buffer of the second computing device in response to the buffer command.

17. The non-transitory computer-readable media of claim 15, wherein the audio data comprises a continuous audio stream.

18. The non-transitory computer-readable media of claim 15, wherein execution of the computer-executable instructions by the processor further causes the processor to:

obtain, from the first computing device, a third audio frame; and obtain, from the second computing device, a fourth audio frame, wherein the audio data comprises the first audio frame and the fourth audio frame.

19. The non-transitory computer-readable media of claim 15, wherein execution of the computer-executable instructions by the processor further causes the processor to:

obtain, from the first computing device, a third audio frame; and obtain, from the second computing device, a fourth audio frame, wherein to generate the audio data, the execution of the computer-executable instructions by the processor further causes the processor to:

interleave the first audio frame and the fourth audio frame within a continuous audio stream, wherein the audio data comprises the continuous audio stream.

20. The non-transitory computer-readable media of claim 15, wherein execution of the computer-executable instructions by the processor further causes the processor to:

perform one or more of noise suppression, automatic gain control, or echo cancellation to the audio data; and generate the output based on performing the one or more of the noise suppression, the automatic gain control, or the echo cancellation to the audio data.

* * * * *